(12) United States Patent
Josset et al.

(10) Patent No.: US 10,819,082 B2
(45) Date of Patent: Oct. 27, 2020

(54) MULTIFREQUENCY OCEAN LIDAR POWER OPTIMIZER

(71) Applicant: The Government of the United States of America, as represented by the Secretary of the Navy, Arlington, VA (US)

(72) Inventors: Damien Josset, Covington, LA (US); Anna Yue, Auburn, GA (US); Weilin Hou, Slidell, LA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 16/523,088

(22) Filed: Jul. 26, 2019

(65) Prior Publication Data
US 2020/0033460 A1 Jan. 30, 2020

Related U.S. Application Data

(60) Provisional application No. 62/703,536, filed on Jul. 26, 2018.

(51) Int. Cl.
| | |
|---|---|
| *H01S 3/13* | (2006.01) |
| *H01S 3/131* | (2006.01) |
| *H01S 3/094* | (2006.01) |
| *H01S 3/06* | (2006.01) |
| *H01S 3/108* | (2006.01) |

(Continued)

(52) U.S. Cl.
CPC ............ *H01S 3/131* (2013.01); *H01S 3/0092* (2013.01); *H01S 3/0602* (2013.01); *H01S 3/08086* (2013.01); *H01S 3/094* (2013.01); *H01S 3/094096* (2013.01); *H01S 3/1083* (2013.01); *H01S 3/1312* (2013.01);
(Continued)

(58) Field of Classification Search
CPC ........ H01S 3/0602; H01S 3/094; H01S 3/131; H01S 3/1312; H01S 3/0092; H01S 3/08086; H01S 3/1083; H01S 3/094096; H01S 5/0604; H01S 5/0092; H01S 5/1092
See application file for complete search history.

(56) References Cited

U.S. PATENT DOCUMENTS

| | | | |
|---|---|---|---|
| 4,893,924 A | | 1/1990 | Leonard |
| 5,102,222 A | * | 4/1992 | Berger .................... G01J 4/04 356/365 |

(Continued)

OTHER PUBLICATIONS

Delplancke, F., Automated High-Speed Mueller Matrix Scatterometer, Applied Optics, vol. 36, No. 22, Aug. 1, 1997.
(Continued)

*Primary Examiner* — Kinam Park
(74) *Attorney, Agent, or Firm* — US Naval Research Laboratory; William Ladd

(57) ABSTRACT

Systems and methods are provided for optimizing the energy output of a laser system, such as a Light Detection and Ranging (LIDAR) system, by allowing the laser system to be tuned while the laser is in operation. For example, in an embodiment, a sensor, such as a photoresistor, is used to perform a scan to determine whether turning the crystal will result in increased energy. Crystal turners, such as servo motors, can be used to turn the crystal until the energy stops increasing.

20 Claims, 10 Drawing Sheets

(51) Int. Cl.
*H01S 3/08* (2006.01)
*H01S 3/00* (2006.01)
*H01S 5/00* (2006.01)
*H01S 5/10* (2006.01)
*H01S 5/06* (2006.01)

(52) U.S. Cl.
CPC .......... *H01S 5/0092* (2013.01); *H01S 5/0604* (2013.01); *H01S 5/1092* (2013.01)

(56) References Cited

U.S. PATENT DOCUMENTS

| | | | |
|---|---|---|---|
| 5,270,780 A | 12/1993 | Moran | |
| 6,647,034 B1* | 11/2003 | Smith | H01S 3/1083 372/21 |
| 8,761,214 B2* | 6/2014 | Hwang | G02B 26/007 372/22 |
| 8,953,647 B1* | 2/2015 | Mead | H01S 3/1616 372/6 |
| 10,094,928 B2 | 10/2018 | Josset | |
| 2005/0286573 A1* | 12/2005 | Hand | H01S 5/141 372/22 |
| 2006/0083111 A1 | 4/2006 | Grasso | |
| 2006/0227317 A1 | 10/2006 | Henderson | |
| 2008/0170235 A1 | 7/2008 | Rogers | |
| 2010/0245963 A1* | 9/2010 | Shibatani | H02N 2/025 359/221.2 |
| 2010/0329291 A1 | 12/2010 | Sanders | |
| 2011/0019188 A1 | 1/2011 | Ray | |
| 2013/0182259 A1 | 7/2013 | Brezinski | |
| 2013/0314694 A1 | 11/2013 | Tchoryk, Jr. | |
| 2015/0219498 A1 | 8/2015 | Tillotson | |

OTHER PUBLICATIONS

Lara, David, Dainty, Chris, Axially resolved complete Mueller matrix confocal microscopy, Applied Optics, vol. 45, No. 9, Mar. 20, 2006.

Kacenelenbogen, M., et al., An accuracy assessment of the CALIOP/CALIPSO version 2/version 3 daytime aerosol extinction product based on a detailed multi-sensor, multi-platform case study, Atmos. Chem. Phys., 11, 3981-4000, 2011, Apr. 29, 2011.

* cited by examiner

MULTIFREQUENCY OCEAN LIDAR POWER OPTIMIZER

CROSS REFERENCE TO RELATED APPLICATIONS

This application claims the benefit of U.S. Provisional Patent Application No. 62/703,536, filed on Jul. 26, 2018, which is incorporated by reference herein in its entirety.

FEDERALLY SPONSORED RESEARCH AND DEVELOPMENT

The United States Government has ownership rights in this invention. Licensing inquiries may be directed to Office of Technology Transfer at US Naval Research Laboratory, Code 1004, Washington, D.C. 20375, USA; +1.202.767.7230; techtran@nrl.navy.mil, referencing Navy Case Number 106605-US2.

FIELD OF THE DISCLOSURE

This disclosure relates to laser systems, including Light Detection and Ranging (LIDAR) systems.

BACKGROUND

Laser systems, such as Light Detection and Ranging (LIDAR) systems can be used for a variety of applications, including for environmental analysis. For example, utilized as a remote sensing tool, a LIDAR system can generate pulsed light with a laser to create precise, three-dimensional data underwater, allowing scientists to accurately examine the environment. For some applications, it can be desirable to tune a laser while the laser is active. However, during operation, the laser poses a safety hazard, and constant manual monitoring and tuning can be impractical and unsafe.

BRIEF DESCRIPTION OF THE DRAWINGS/FIGURES

The accompanying drawings, which are incorporated in and constitute part of the specification, illustrate embodiments of the disclosure and, together with the general description given above and the detailed descriptions of embodiments given below, serve to explain the principles of the present disclosure. In the drawings.

Figure 1:
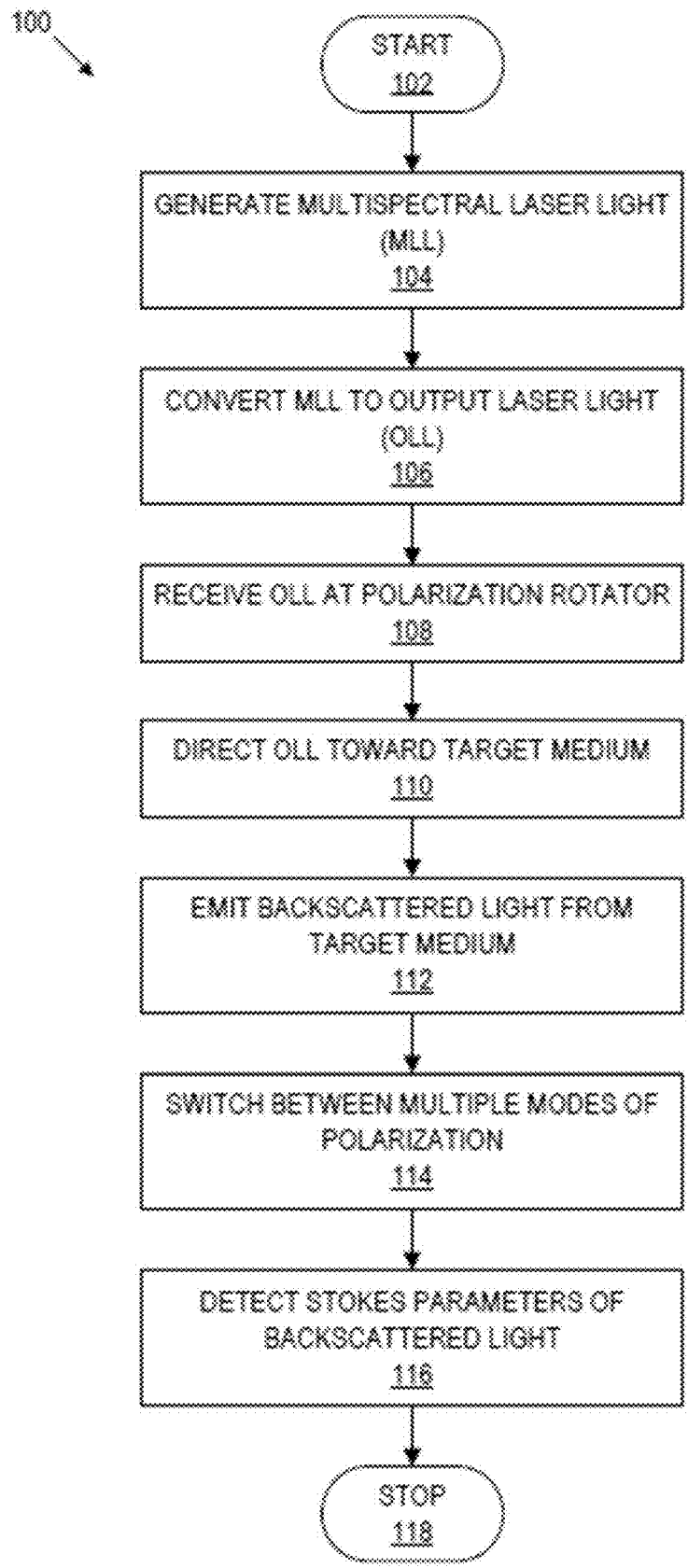
FIG. 1 is an example workflow for turbulence ocean LIDAR (TURBOL) in accordance with an embodiment of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

In the following description, numerous specific details are set forth to provide a thorough understanding of the disclosure. However, it will be apparent to those skilled in the art that the disclosure, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to understand that such description(s) can affect such feature, structure, or characteristic in connection with other embodiments whether or not explicitly described.

1. OVERVIEW

In an embodiment, to optimize its energy output, a laser needs to be constantly tuned, wasting valuable time and effort. Additionally, the gain of a detector has to be adjusted accordingly, which hinders data collection. Embodiments of the present disclosure can optimize the energy output of a laser system, such as a Light Detection and Ranging (LIDAR) system, by allowing the laser system to be tuned while the laser is in operation. For example, in an embodiment, a sensor, such as a photoresistor, is used to perform a scan to determine whether turning the crystal will result in increased energy. Crystal turners, such as servo motors, can be used to turn the crystal until the energy stops increasing. By introducing an autonomous tuning system to a laser in accordance with embodiments of the present disclosure, scientists will be able to employ the functions of a laser system more efficiently and productively.

2. EXEMPLARY LASER SYSTEMS

Transceiver geometry can significantly affect the performance of a laser system, such as a LIDAR system. Typically, there are 3 types of designs for transceiver geometries: (1) biaxial; (2) coaxial; and (3) in-line. A biaxial design is easy to implement and is best suited for space/airborne applications or a large telescope field of view (i.e., high occurrence of multiple scattering). A coaxial design performs well but has a near field blind zone, which makes it suboptimal for laboratory environments. An in-line design can be difficult due to high power requirements, which can cause light leaks and can saturate/damage receivers. The in-line design has been implemented with infrared (i.e., optical circulator) and a circular polarization such as in high spectral resolution LIDAR (HSRL). With respect to aquatic environments, surface waves can impact the geometry of biaxial and coaxial designs. Specifically, it can be difficult to collect sing-scatter LIDAR measurements like beam attenuation coefficient from a LIDAR system deployed on a ship.

Figure 3:
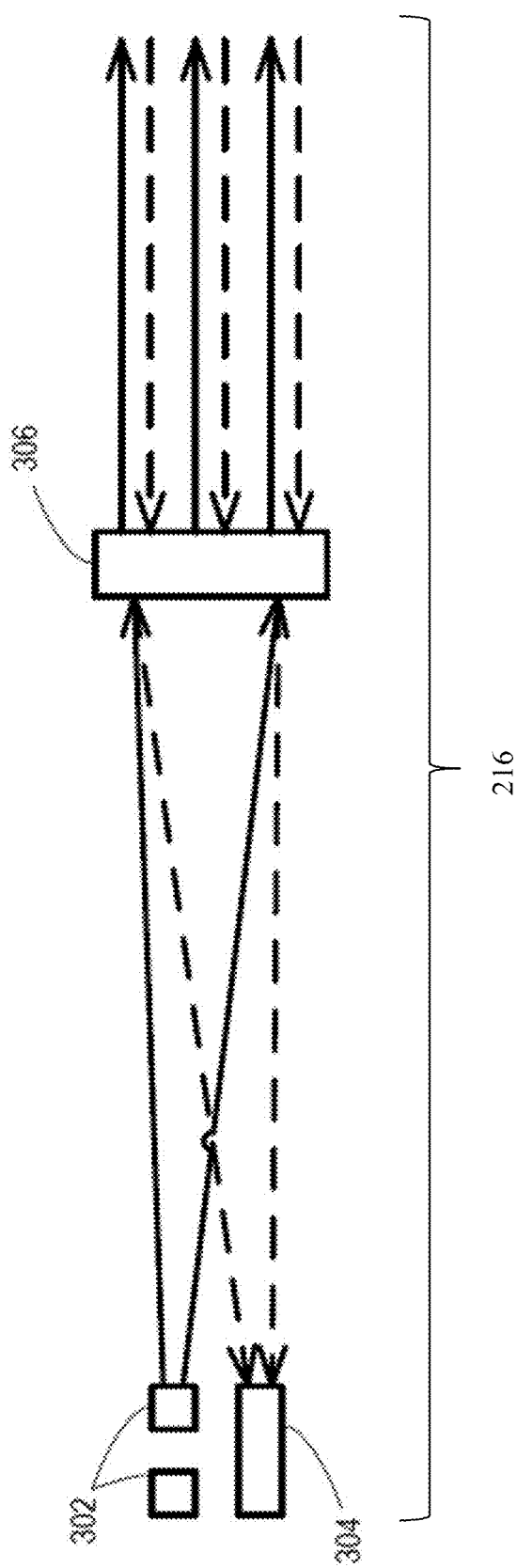
FIG. 3 is a diagram of an exemplary telescope for a laser system in accordance with an embodiment of the present disclosure.

A laser system in accordance with an embodiment of the present disclosure can use a dual-use telescope as shown in FIG. 3 to address the aforementioned issues. In an embodiment, the dual-use telescope is used for both emission and reception of light by having a full overlap of laser and receiver's field of view. Such a configuration eliminates the close field blind zone. In an embodiment, the dual-use telescope has a quasi-backscatter geometry and a small field of view, preventing large angle multiple scattering. Further, a laser system in accordance with an embodiment of the present disclosure is capable of identifying signatures of turbulence in three key properties of light: polarization, color/frequency, and intensity.

Underwater polarization can be used to study the optical signature of inorganic particles in coastal waters from remote sensing. Specifically, recent research has shown that scattering due to optical turbulence can be expressed as a function of the depolarization rate. For example, the ratio of red to green polarized reflectance can be expressed a function of sediment concentration in coastal area. In another example, a mean depolarization rate with error bars can be expressed as a function of the Rayleigh number.

The properties of light can be described by the Stokes parameters. A laser system in accordance with an embodiment of the present disclosure is capable of retrieving all four of the Stokes parameters according to the LIDAR retrieval equation shown below in Equation (1):

$$M \begin{pmatrix} P_0 \\ P_1 \\ P_2 \\ P_3 \end{pmatrix} = \begin{pmatrix} S_0 \\ S_1 \\ S_2 \\ S_3 \end{pmatrix}, \quad (1)$$

In Equation (1), M is a LIDAR calibration matrix, $P_n$ are the photomultiplier signals, and $S_n$ are the Stokes parameters. $S_1$ is associated with intensity, $S_2$ and $S_3$ are associated with linear polarization, and $S_4$ is associated with circular polarization. An uncertainty estimate for the Stokes parameters can be calculated as shown below in Equation (2):

$$M^{-1}(\Delta P - \Delta M \cdot S) = \begin{pmatrix} \Delta S_0 \\ \Delta S_1 \\ \Delta S_2 \\ \Delta S_3 \end{pmatrix}, \quad (2)$$

In an embodiment, the uncertainty estimate can be improved by additional calibration measurements, hardware modification, etc.

Embodiments of the present disclosure can use a combination of polarizers and quarter wave plate to allow four receivers to be sensitive to three states of polarization. Quarter wave plates allow for analysis of a returned signal that is in a circular polarization state, which provides all four elements of the Stokes vector by the four receivers, including the intensity in addition to the three polarization elements. In an embodiment, each data point provides a measurement vector P. The Stokes Parameters $S_n$ can be obtained from a set of reference measurements as well as the associated uncertainty estimate. In an embodiment, the rotation of a quarter wave plate allows for the receiver system to be characterized. Specifically from this derivation of the matrix M, S and ΔS can be determined.

While the four Stokes parameters describe properties of light, the properties of the medium can be described by a Mueller Matrix with 16 elements from Equations (3) and (4) below:

$$S_{incident} = \begin{pmatrix} S_{0,incident} \\ S_{1,incident} \\ S_{2,incident} \\ S_{3,incident} \end{pmatrix} \quad (3)$$

$$S_{backscatter} = M_{ocean} * S_{incident} \quad (4)$$

In Equations (3) and (4), $S_{incident}$ is incident laser light and $S_{backscatter}$ is backscattered light. Varying the polarization states of the laser light allows all elements of the Mueller Matrix to be retrieved.

Embodiments of the present disclosure can also use two Pockel cells to modulate polarization, which allows the laser system to be switched between three modes of polarization: (1) laser liner polarization ($S_1$=−1, $S_2$=$S_3$=0); (2) Mode 1 that controls both rotation and ellipticity; and (3) Mode 2 that controls ellipticity.

FIG. 1 is an example workflow for turbulence ocean LIDAR (TURBOL) in accordance with an embodiment of the present disclosure. As is the case with the other processes described herein, various embodiments may not include all of the steps described below, may include additional steps, and may sequence the steps differently. Accordingly, the specific arrangement of steps shown in FIG. 1 should not be construed as limiting the scope of TURBOL.

In block 102, the method starts and proceeds to block 104, where multispectral laser light (MLL) is generated. For example, the MLL can include four lasers that are eventually 411-703 nm, 532 nm, 1064 nm, and 716-2590 nm. In block 106, the MLL is converted to output laser light (OLL). In this example, an optical parametric oscillator (OPO) can be used to convert the MLL to 411-703 nm and 532 nm lasers. In block 108, the OLL is received at a polarization rotator. The polarization rotator can be used to change a polarization mode of the OLL. Examples of polarization modes include laser liner polarization, Mode 1 for controlling both rotation and ellipticity, and Mode 2 for controlling ellipticity.

In block 110, the OLL is directed toward a target medium. In block 112, the target medium reflects the OLL to return backscattered light. As the OLL is emitted as described above, the polarization mode can be switched between the different modes in block 114. Because the OLL is switched between the three polarization modes, the Stokes parameters of the backscatter light can be detected in block 116. The Stokes parameters can then be used to characterize underwater turbulence in the target medium.

Figure 2:
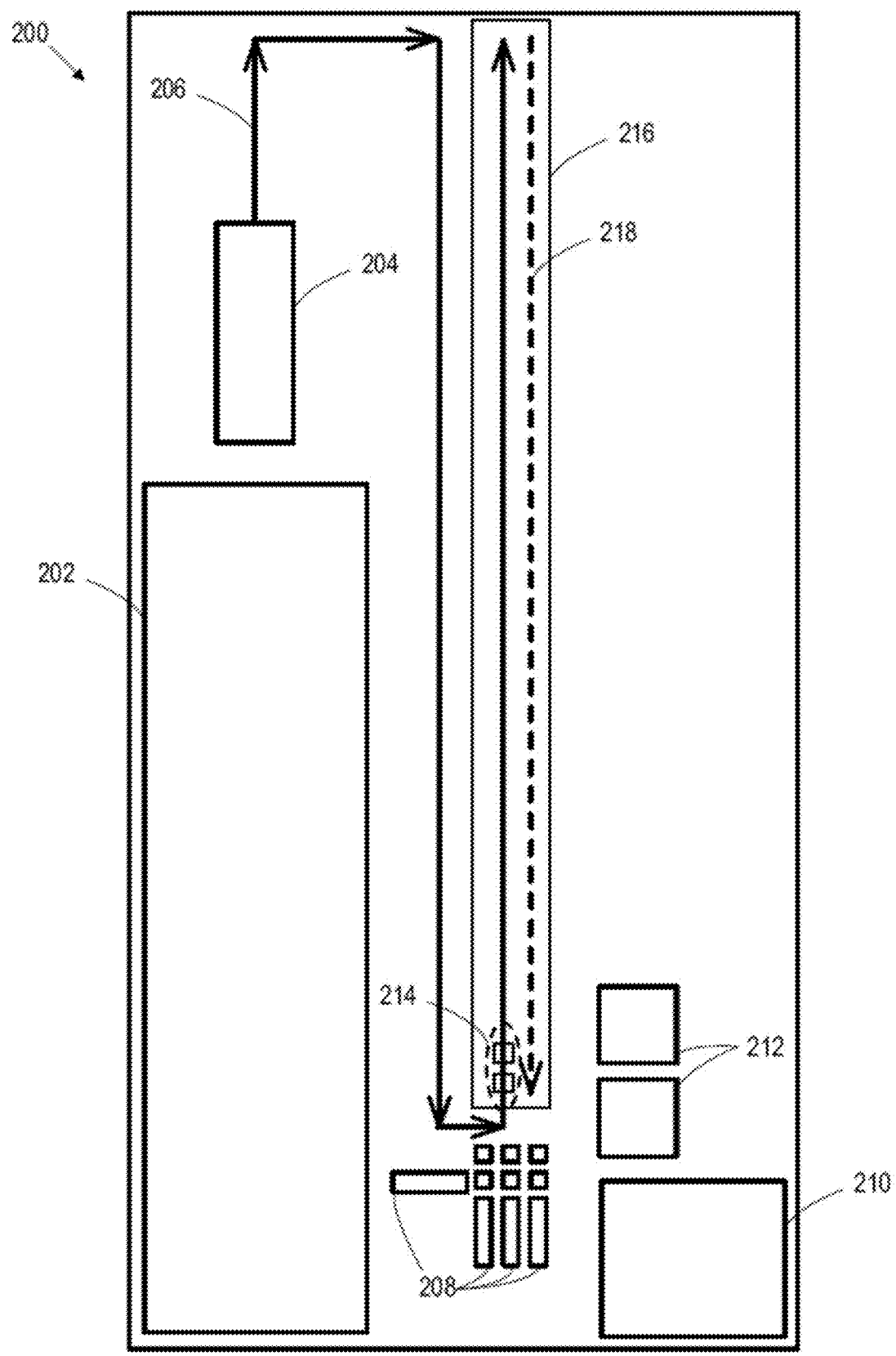
FIG. 2 is a diagram of an exemplary laser system in accordance with an embodiment of the present disclosure.

FIG. 2 is a diagram of an exemplary laser system 200 in accordance with an embodiment of the present disclosure. In an embodiment, laser system 200 is a LIDAR system. The laser system 200 includes a laser pump 202, an optical parametric oscillator (OPO) 204, photomultiplier modules 208, a peripheral component interconnect (PCI) chassis 210 (e.g., a PCI eXtensions for Instrumentation Express (PXIE) chassis), pockels cell drivers 212, and a telescope 216. In an embodiment, laser pump 202 is configured to emit multispectral laser light (MLL), which can be at least partially directed at the OPO 204. In an embodiment, OPO 204 is configured to convert the MLL to output laser light 206 (OLL), which is directed to the telescope 216.

In an embodiment, telescope 216 includes a polarization rotator 214 (i.e., pockel cells). In an embodiment, polarization rotator 214 is configured to change the polarization mode of OLL 204 being directed through the telescope 216. In an embodiment, polarization rotator 214 is controlled by pockel cell drivers 212. In an embodiment, OLL 204 emitted from the telescope 216 is directed to a target medium (not shown), which reflects the OLL 204 as backscattered light 218 in telescope 216. In an embodiment, telescope 216 is also configured to direct backscattered light 218 to photomultiplier modules 208.

In an embodiment, photomultiplier modules 208 are configured to detect Stokes parameters of backscattered light 218. As the polarization mode is changed by polarization rotator 214, photomultiplier modules 208 are able to detect different Stokes parameters until all 16 Stokes parameters are detected. In some cases, an interferometric setup can be used for photomultiplier modules 208 to detect Stokes parameters.

In an embodiment, PCI chassis 210 enables components (e.g., pockel cell drivers 212, controller components (not shown), data interfaces (not shown), etc.) of laser system 200 to communicate with each other. In an embodiment, PCI chassis 210 can also act as an enclosure to protect components of laser system 200.

FIG. 3 is a diagram of an exemplary telescope 216 for a laser system in accordance with an embodiment of the present disclosure. In an embodiment, telescope 216 includes polarization rotators 302, a small concave lens 304, and a large convex lens 306. In an embodiment, OLL of a specified polarization mode is emitted from polarization rotator 302 towards the large convex lens 306. In an embodiment, the OLL is then directed by large convex lens 306 to a target medium. In an embodiment, backscattered light reflected by the target medium is returned to large convex lens 306. In an embodiment, because the same telescope 216 is used for emission and reception, there is (1) full overlap of laser and receiver field of view; (2) no close field blind zone; (3) a quasi-backscatter geometry; and (4) a small field of view (i.e., no large angle multiple scattering). The same telescope 216 can be used for both because of the reciprocity of light propagation. In an embodiment, laser system 200 uses the same optical path for forward propagation of the light and backward propagation of the backscattered signal to be detected through the same path, which ensures a small collecting angle and eliminates multiple scattered photons. Multiple scatter photons are associated with larger angles relative to the receiver telescope path and field of view.

Figure 4:
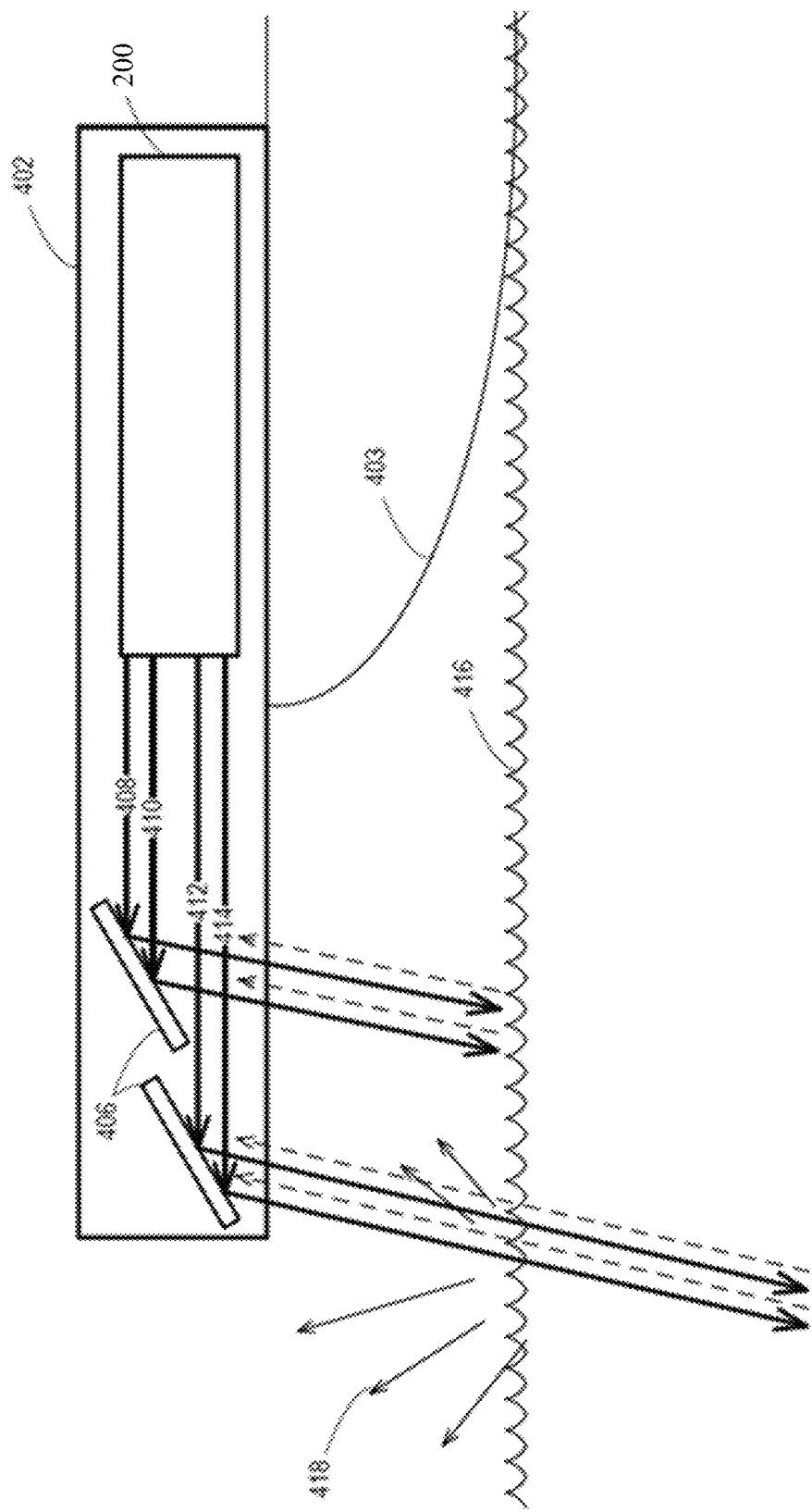
FIG. 4 is a diagram of an exemplary laser system deployed on a boat in accordance with an embodiment of the present disclosure.

FIG. 4 is a diagram of an exemplary deployed laser system 402 deployed on a vessel 403 in accordance with an embodiment of the present disclosure. In an embodiment, deployed laser system 402 includes a laser system 200 that is similar to laser system 200 discussed above with respect to FIG. 2. In an embodiment, deployed laser system 402 also includes mirrors 406 that are configured to reflect OLL emitted from laser system 200 toward a target medium 416 (e.g., water).

For example, in FIG. 4, laser system 200 can emit four wavelengths: (1) a 532 nm laser 412; (2) a 420-505 nm laser 414; (3) a 1064 nm laser 410; and (4) a 1200-2035 nm laser 408. In an embodiment, each of the four laser wavelengths is reflected off mirrors 406 towards target medium 416, which reflects backscattered light that is in turn reflected by mirrors 406 back towards laser system 200. In this example, the polarization mode of each of the four laser wavelengths can be modified as backscattered light is detected and used to determine Stokes parameters.

Figure 5:
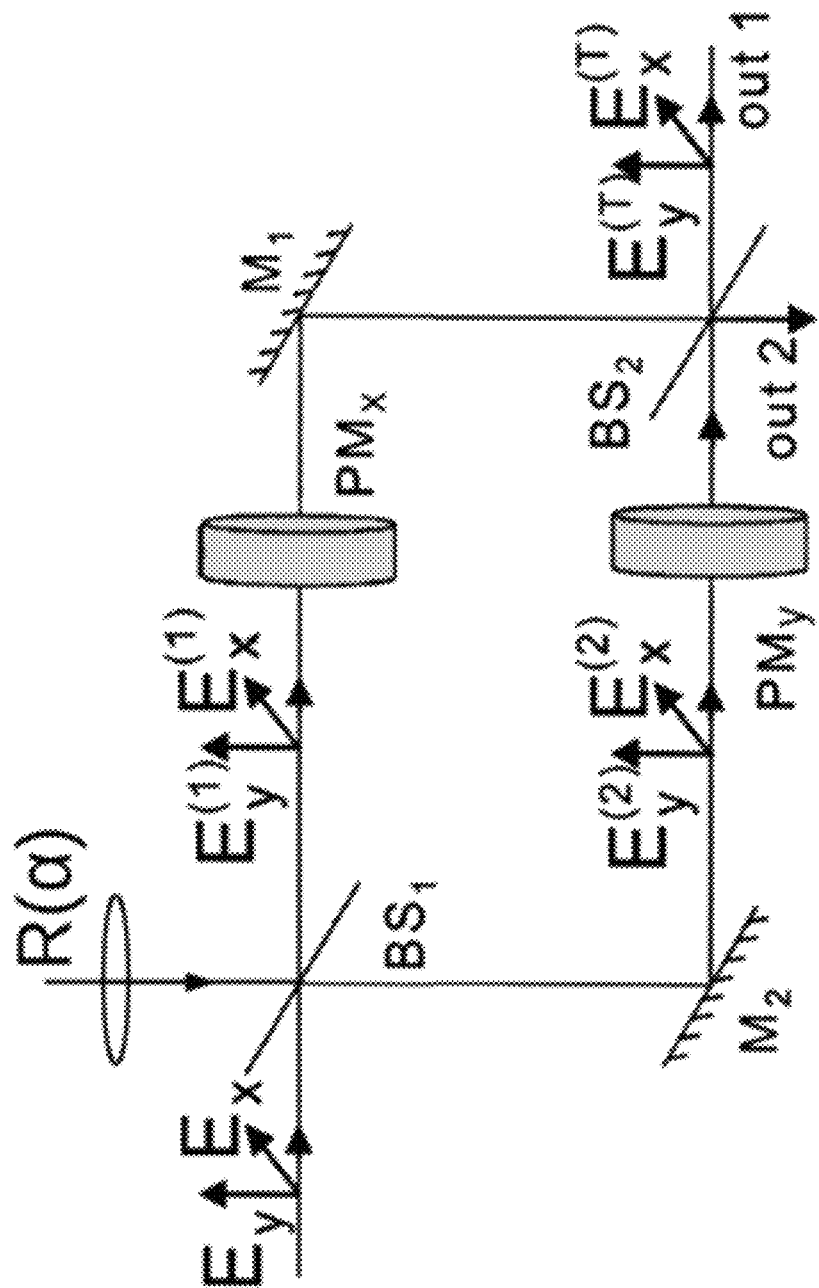
FIG. 5 is an example interferometric setup for performing TURBOL in accordance with an embodiment of the present disclosure.

FIG. 5 is an example interferometric setup 500 for performing TURBOL in accordance with an embodiment of the present disclosure. Interferometric setup 500 shows two different paths that are used to extract the influence of the medium on beam propagation laser signals $E_x$, $E_y$ that are mixed with a reference signal $R(\alpha)$ through beam splitter $BS_1$. The first path is directed through photomultiplier $PM_x$ toward mirror $M_1$, and the second path is reflected off mirror $M_1$ toward photomultiplier $PM_y$. Phase changes between photomultiplier $PM_x$ and photomultiplier $PM_y$ are combined by the beam splitter $BS_2$ to be detected as output (out 1, out 2) for characterizing interference patterns, which are used to estimate the state of turbulence strength differences between the two paths. The interferometric setup 500 is capable of self-calibration of the polarization channel and allows for one receiver to provide the four Stokes Parameters (other receivers can then be used for other wavelengths).

3. EXEMPLARY POWER OPTIMIZER SYSTEMS

In the field, the laser energy of a laser system, such as a LIDAR, can naturally degrade over time (e.g., because of the temperature sensitivity of the nonlinear crystals). A constant manual monitoring and tuning of the laser within the enclosure is both impractical and unsafe. A higher level of temperature control would require a lot of power. In an embodiment, a small automatic control system capable of monitoring the energy level of the laser and adjusting the position of the nonlinear optical crystals to optimize the laser energy output is used to provide a safe, efficient, and cheap way of optimizing power for the laser system.

Figure 6:
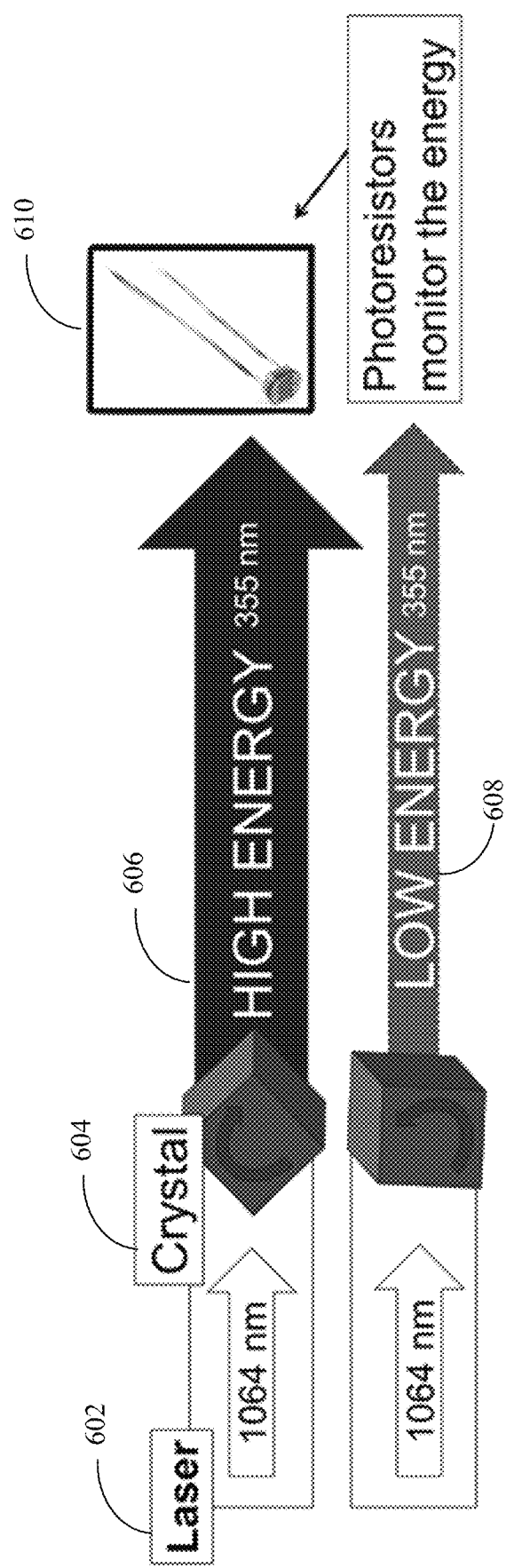
FIG. 6 is a diagram illustrating turning a crystal to tune a laser in accordance with an embodiment of the present disclosure.

FIG. 6 is a diagram illustrating turning a crystal to tune a laser in accordance with an embodiment of the present disclosure. As shown in FIG. 6, a laser 602 can be configured to produce a high amount of energy 606 or a low amount of energy 608 depending on the configuration of a crystal 604. In an embodiment, photoresistor(s) 610 can be used to sense the energy output from the crystal 604 before, during, and/or after the crystal 604 is turned. In an embodiment, the output of photoresistor(s) 610 is sent to a controller, which instructs crystal turners to turn the crystal 604 until power is optimized.

Figure 7:
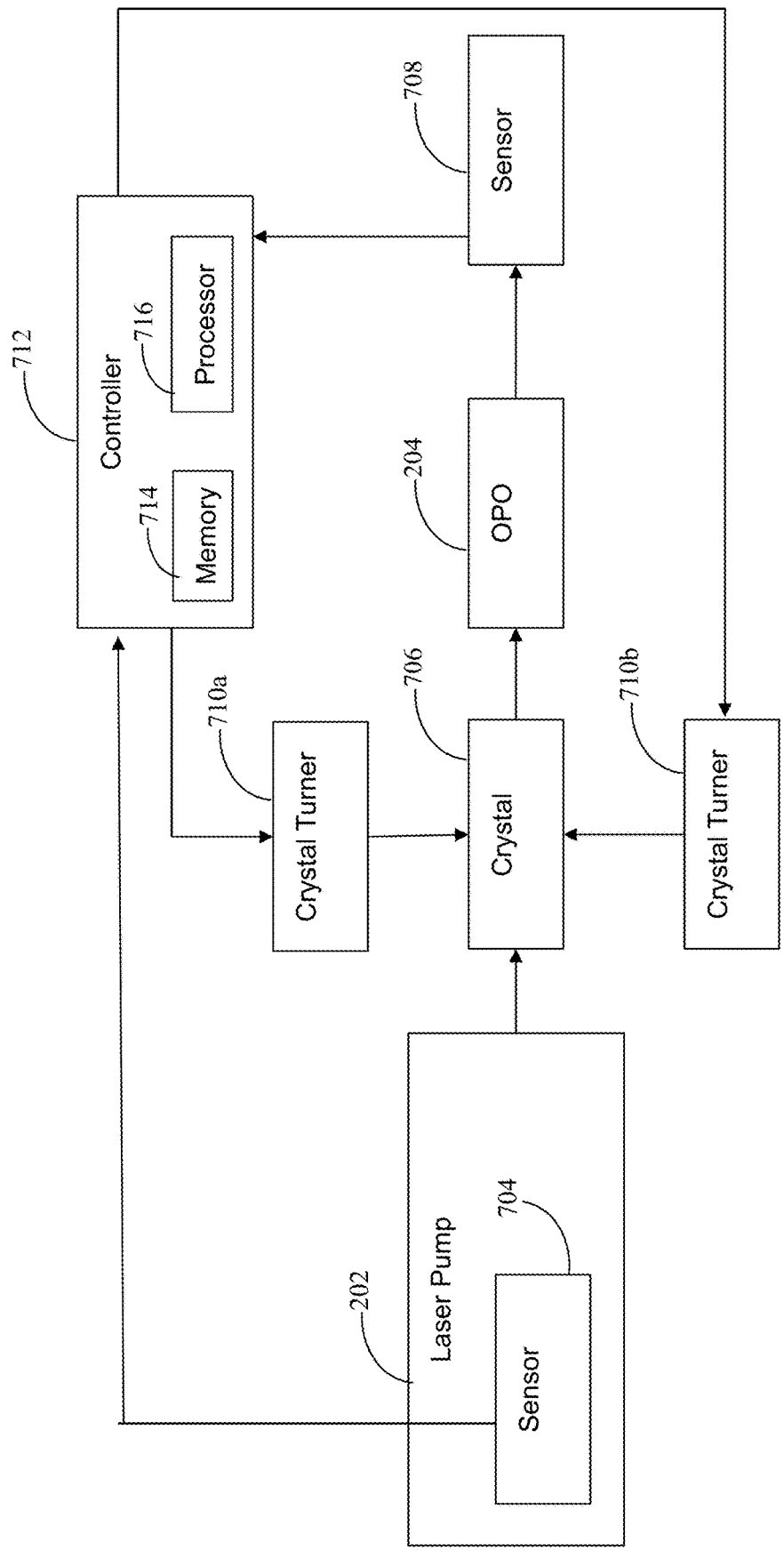
FIG. 7 is a diagram of an exemplary power optimizer for a laser system in accordance with an embodiment of the present disclosure.

FIG. 7 is a diagram of an exemplary power optimizer for a laser system in accordance with an embodiment of the present disclosure. In FIG. 7, a first sensor 704 (e.g., a photoresistor) can be installed in, on, or near laser pump 202 and can be used to measure the light created by the laser pump 202 (e.g., 1064 nm) and crystal 706 (e.g., 532/355 nm). In an embodiment, first sensor 704 is optional. In an embodiment, crystal 706 is used to create light of a desired frequency based on the predetermined beam from laser pump 202. For example, in an embodiment, laser pump 202 can be configured to generate a 1064 nm beam, and crystal 706 can receive the 1064 nm beam and generate one or more beams of a desired frequency (e.g., depending on how crystal 706 is rotated). In an embodiment, the laser light is very focused, but it is intense enough that a small part of it is scattered everywhere inside the enclosure of laser pump 202. In an embodiment, first sensor 704 checks that laser pump 202 is on (e.g., because it sees this scattered light). In FIG. 7, a second sensor 708 (e.g., a photoresistor) measures the relative changes of the laser light out of optical parametric oscillator 204. In an embodiment, the output of OPO 204 is very sensitive to the 355 nm light intensity out of the crystal and is easier to measure.

In an embodiment, measurements from first sensor 704 and second sensor 708 are sent to a controller 712. In an embodiment, the signal from first sensor 704 instructs controller 712 that the laser is on and that the energy improvement process can be started (i.e., there is no need to do anything if the laser is not on). In an embodiment, the measurement from second sensor 708 is stored (e.g., in a table in memory, such as memory 714) that allows controller 712 to know how the energy of the laser varies as a function of time. In an embodiment, controller 712 can send signals (e.g., a square wave signal) to crystal turners 710 (e.g., servo motors attached to crystal 706, such as HS-422 servomotors) to find the maximum energy of the laser.

For example, in an embodiment, controller 712 can keep a record of the measurements from sensor 708 in real time so controller 712 knows when the energy is/was at a maximum value or when it drops as crystal turners 710 turn crystal 706. In an embodiment, the ideal configuration of crystal 706 can be always shifting due to changes in temperature, especially in the field, so the signal from sensor 708 must be continuously monitored by controller 712 so that crystal 706 can be tuned accordingly.

While sensors 704 and 708 are described above as photoresistors, it should be understood that a variety of sensors can be used to transmit data to controller 712. While two crystal turners 710a and 710b are shown in FIG. 7, it should be understood that multiple variations in numbers and types of crystal turners can be used in accordance with embodiments of the present disclosure. For example, one crystal turner, three crystal turners, or more than three crystal turners can also be used in accordance with embodiments of the present disclosure. Further, while two sensors 704 and 708 are shown in FIG. 7, it should be understood that, in an embodiment, a single sensor can be used and that more than two sensors can be used in accordance with embodiments of the present disclosure. For example, in an embodiment, additional sensors can be added to optimize other elements of a laser system in accordance with an embodiment of the present disclosure.

In an embodiment, controller 712 includes a memory 714 and a processor 716. In an embodiment, controller 714 does not include memory 714 or processor 716. In an embodiment, memory 714 and/or processor 716 are located externally to controller 712, and controller 712 is configured to communicate with memory 714 and/or processor 716. Controller 712 can be implemented using software, hardware, and/or a combination of software and hardware. In an embodiment, controller 712 is a microcontroller, such as an ATMEGA328P microcontroller. In an embodiment, controller 712 is a special purpose controller device. In an embodiment, controller 712 is integrated into a host device, such as a general purpose computer. In an embodiment, controller 712 is a general purpose computer.

Elements of FIG. 7 can be implemented using a single device or multiple devices in accordance with embodiments of the present disclosure. For example, in an embodiment, elements of FIG. 7 can be integrated into laser system 200. In an embodiment, all elements of FIG. 7 except controller 712 can be integrated into laser system 200 (e.g., in an embodiment, elements of FIG. 7 can be controlled using an external controller 712).

Figure 8:
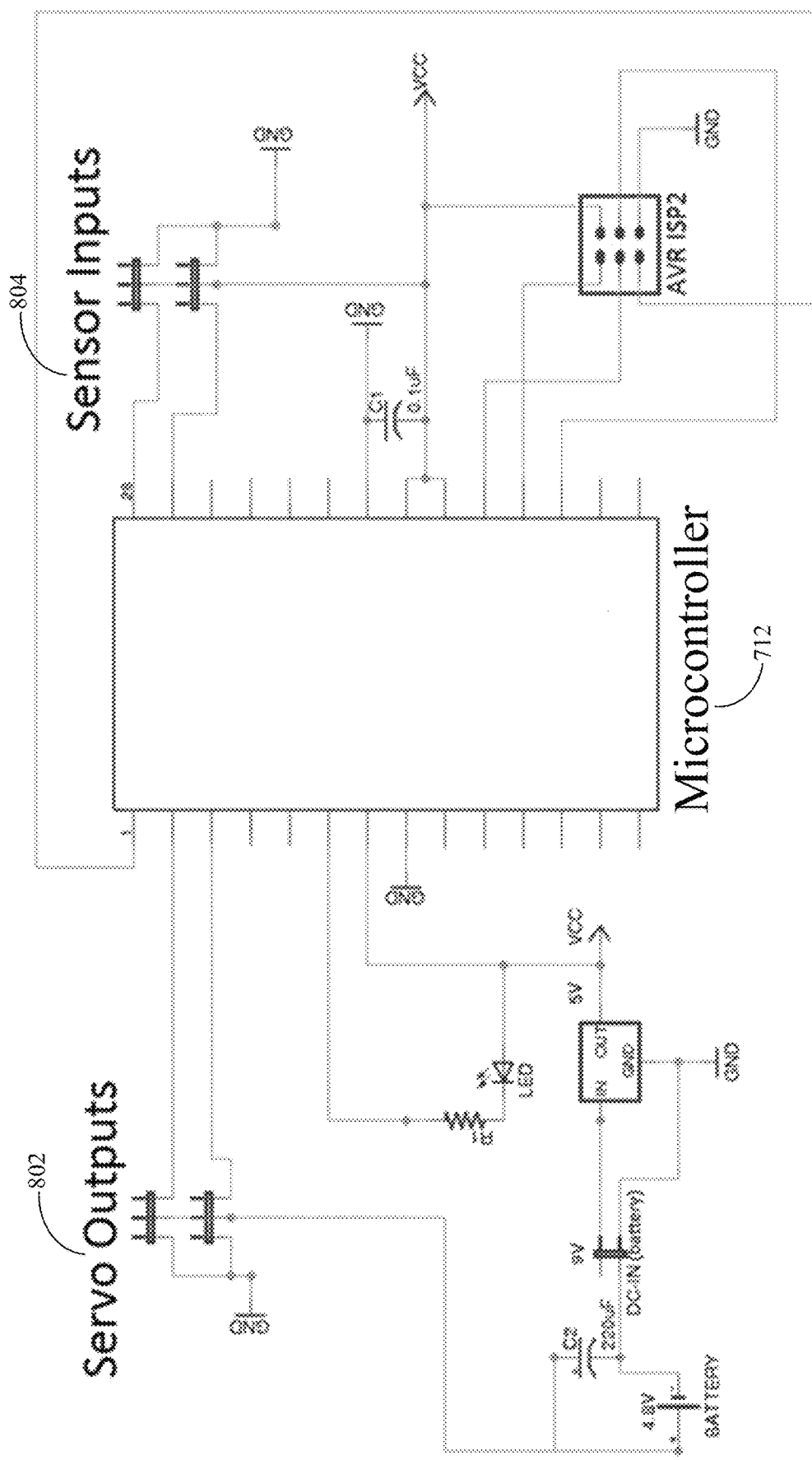
FIG. 8 is a circuit diagram for an exemplary power optimizer for a laser system in accordance with an embodiment of the present disclosure.

FIG. 8 is a circuit diagram for an exemplary power optimizer for a laser system in accordance with an embodiment of the present disclosure. In FIG. 8, controller 712 is implemented as a microcontroller. In FIG. 8, controller 712 is coupled to servo outputs 802, which are used to control crystal turners 710. Further, in FIG. 8, controller 712 is coupled to sensor inputs 804, which are used to transmit signals from sensors 704 and 708 to controller 712.

Figure 9:
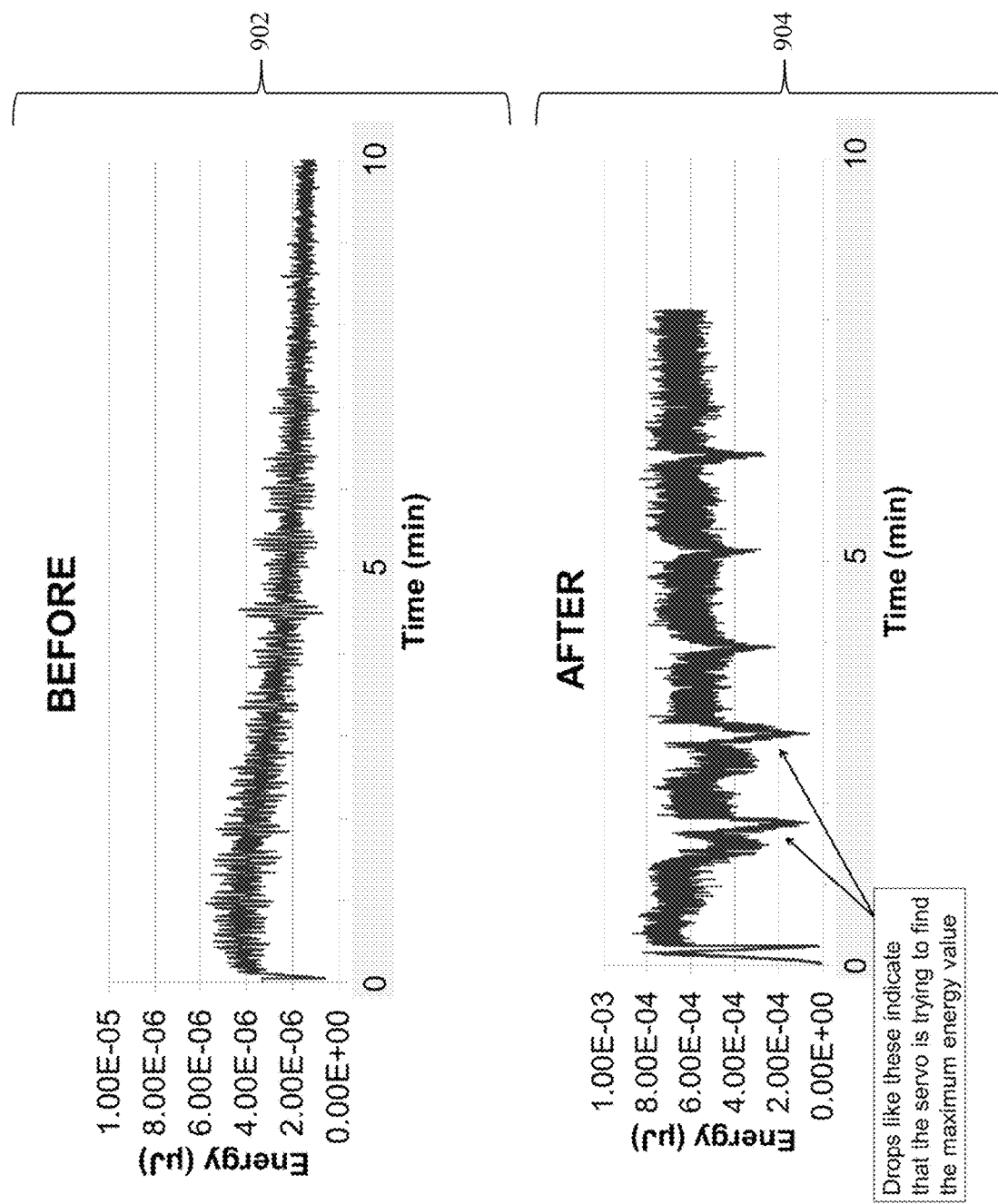
FIG. 9 is a diagram showing exemplary results of a power optimizer for a laser system in accordance with an embodiment of the present disclosure.

FIG. 9 is a diagram showing exemplary results of a power optimizer for a laser system in accordance with an embodiment of the present disclosure. In the field, the energy from laser system 200 naturally degrades over time, as shown by diagram 902. In comparison, when a power optimizer system in accordance with an embodiment of the present disclosure is installed into laser system 200 (e.g., as shown in FIG. 7), the laser can maintain a more stable output of energy, as shown by diagram 904.

5. EXEMPLARY METHODS

Figure 10:
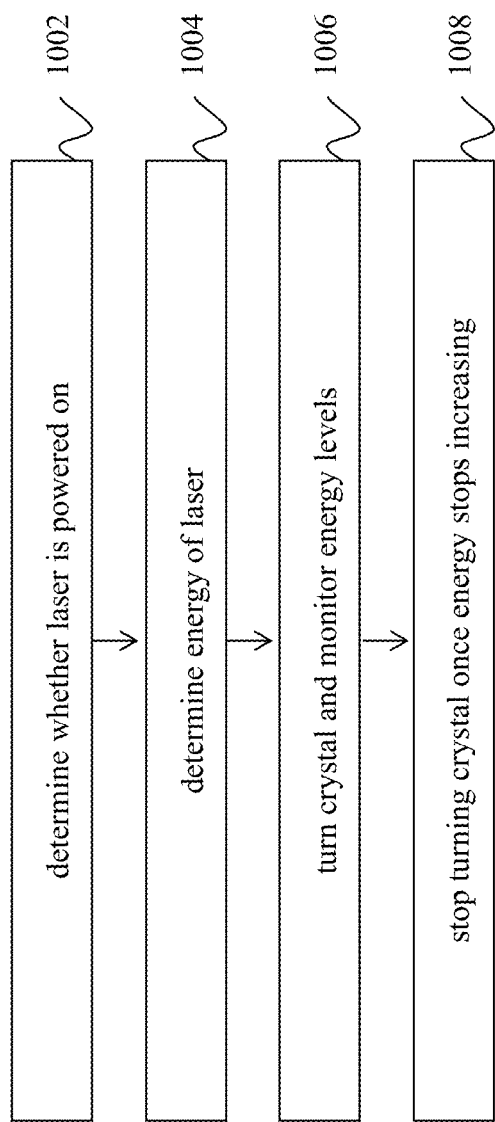
FIG. 10 is a diagram of an exemplary method for optimizing power for a laser system in accordance with an embodiment of the present disclosure.

FIG. 10 is a diagram of an exemplary method for optimizing power for a laser system in accordance with an embodiment of the present disclosure. In step 1002, a determination is made regarding whether laser is powered on. For example, in an embodiment, sensor 704 senses whether laser pump 202 is powered on and sends a signal to controller 712, informing controller 712 whether laser pump 202 is powered on. In step 1004, the energy of the laser is determined. For example, in an embodiment, sensor 708 measures the relative changes of the laser light out of optical parametric oscillator 204 and sends a signal to controller 712. In an embodiment, sensor 708 continually sends signals to controller 712 regarding the energy of the laser, so that controller 712 can determine when the energy begins to drop.

In step 1006, crystal 706 is turned, and energy levels are monitored. For example, in an embodiment, crystal 706 is turned (e.g., in a predetermined direction) using crystal turners 710, and sensor 708 measures the effects that turning crystal 706 has on the laser energy produced and sends the results to controller 712. In step 1008, the turning of crystal 706 is stopped once the energy stops increasing. For example, in an embodiment, sensor 708 continually sends signals to controller 712 regarding the energy from the laser. Once turning crystal 706 no longer results in sensor 708 detecting increased energy, controller 712 can instruct crystal turners 710 to stop turning crystal 706.

In an embodiment, if crystal 706 is turned "too far," resulting in a lower energy, controller 712 can instruct crystal turners 710 to turn crystal 706 back to a prior position to correct for the overturning. For example, in an embodiment, controller 712 can initiate a fine-tuning procedure once an approximate crystal position has been located that produces maximum energy, and crystal 706 can be turned back and forth, in increasingly smaller increments, until the position of crystal 706 that produces a maximum energy is located.

In an embodiment, instead of optimizing power for maximum energy, controller 712 can be configured to instruct crystal turners 710 to turn crystal 706 until crystal 706 produces a beam of a predetermined frequency. For example, in an embodiment, controller 712 can be configured to receive information regarding a frequency of a desired beam (e.g., from a user or from a value stored in memory, such as memory 714), and controller 712 can be configured to instruct crystal turners 710 to turn crystal 706 until crystal 706 produces a beam of the desired frequency.

6. CONCLUSION

It is to be appreciated that the Detailed Description, and not the Abstract, is intended to be used to interpret the claims. The Abstract may set forth one or more but not all exemplary embodiments of the present disclosure as contemplated by the inventor(s), and thus, is not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Any representative signal processing functions described herein can be implemented using computer processors, computer logic, application specific integrated circuits (ASIC), digital signal processors, etc., as will be understood by those skilled in the art based on the discussion given herein. Accordingly, any processor that performs the signal processing functions described herein is within the scope and spirit of the present disclosure.

The above systems and methods may be implemented using a computer program executing on a machine, a computer program product, or as a tangible and/or non-transitory computer-readable medium having stored instructions. For example, the functions described herein could be embodied by computer program instructions that are executed by a computer processor or any one of the hardware devices listed above. The computer program instructions cause the processor to perform the signal processing functions described herein. The computer program instructions (e.g., software) can be stored in a tangible non-transitory computer usable medium, computer program medium, or any storage medium that can be accessed by a computer or processor. Such media include a memory device such as a RAM or ROM, or other type of computer storage medium such as a computer disk or CD ROM. Accordingly, any tangible non-transitory computer storage medium having computer program code that cause a processor to perform the signal processing functions described herein are within the scope and spirit of the present disclosure.

While various embodiments of the present disclosure have been described above, it should be understood that they have been presented by way of example only, and not limitation. It will be apparent to persons skilled in the relevant art that various changes in form and detail can be made therein without departing from the spirit and scope of the disclosure. Thus, the breadth and scope of the present disclosure should not be limited by any of the above-described exemplary embodiments.

What is claimed is:

1. A laser system, comprising:
a laser configured to generate a first laser beam;
a crystal configured to receive the laser beam and to produce a second laser beam;
a crystal turner, coupled to the crystal;
a sensor configured to detect an energy of the second laser beam; and
a controller, coupled to the sensor and the crystal turner, wherein the controller is configured to:
receive a first signal from the sensor, wherein the signal indicates the energy of the second laser beam, and
send a second signal to the crystal turner instructing the crystal turner to turn the crystal.

2. The laser system of claim 1, wherein the laser system is a Light Detection and Ranging (LIDAR) system.

3. The laser system of claim 1, wherein the sensor is a photoresistor.

4. The laser system of claim 1, wherein the laser comprises a laser pump, and wherein the laser pump comprises a second sensor configured to detect whether the laser pump is turned on.

5. The laser system of claim 4, wherein the second sensor is coupled to the controller, and wherein the controller is configured to receive a third signal from the second sensor instructing the controller whether the laser pump is turned on.

6. The laser system of claim 1, wherein the sensor is configured to continually detect the energy of the second laser beam as the crystal is turned, and wherein the first signal indicates whether the energy of the second laser beam is increasing or decreasing.

7. The laser system of claim 6, wherein the controller is further configured to instruct the crystal turner to turn the crystal until the first signal indicates that the energy of the second laser beam is no longer increasing.

8. The laser system of claim 1, wherein the crystal turner is a servo motor.

9. The laser system of claim 1, further comprising a second crystal turner, coupled to the crystal and the controller, wherein the controller is further configured to send a third signal to the second crystal turner instructing the second crystal turner to turn the crystal.

10. A laser device, comprising:
a laser configured to generate a first laser beam;
a crystal configured to receive the laser beam and to produce a second laser beam;

a first crystal turner, coupled to the crystal;
a second crystal turner, coupled to the crystal;
an optical parametric oscillator (OPO) configured to convert the second laser beam to output laser light (OLL);
a sensor configured to detect an energy of the OLL; and
a controller, coupled to the sensor, the first crystal turner, and the second crystal turner, wherein the controller is configured to:
receive a first signal from the sensor, wherein the signal indicates the energy of the OLL,
send a second signal to the first crystal turner instructing the first crystal turner to turn the crystal,
send a third signal to the second crystal turner instructing the second crystal turner to turn the crystal,
determine whether the first signal indicates whether the energy of the OLL is increasing, and
instruct the first crystal turner and the second crystal turner to stop turning the crystal once the first signal indicates that the energy of the OLL is no longer increasing.

11. The laser device of claim 10, wherein the laser device is a Light Detection and Ranging (LIDAR) device.

12. The laser device of claim 10, wherein the sensor is a photoresistor.

13. The laser device of claim 10, wherein the laser comprises a laser pump, and wherein the laser pump comprises a second sensor configured to detect whether the laser pump is turned on.

14. The laser system of claim 13, wherein the second sensor is coupled to the controller, and wherein the controller is configured to receive a fourth signal from the second sensor instructing the controller whether the laser pump is turned on.

15. The laser device of claim 10, wherein the first crystal turner and the second crystal turner are servo motors.

16. A method for optimizing energy in a laser system, the method comprising:
receiving a first signal from a sensor, wherein the signal indicates the energy of a laser beam produced by a crystal;
sending a second signal to a crystal turner instructing the crystal turner to turn the crystal;
determining whether the first signal indicates whether the energy of the laser beam is increasing; and
instructing the crystal turner to stop turning the crystal once the first signal indicates that the energy of the laser beam is no longer increasing.

17. The method of claim 16, further comprising:
sending a third signal to a second crystal turner instructing the second crystal turner to turn the crystal; and
instructing the second crystal turner to stop turning the crystal once the first signal indicates that the energy of the laser beam is no longer increasing.

18. The method of claim 16, further comprising:
receiving a third signal from a second sensor, wherein the third signal indicates whether the laser system is powered on.

19. The method of claim 18, further comprising:
storing, based on the first signal, a plurality of values of energy of the laser beam in memory, wherein each value in the plurality of values corresponds to a respective position of the crystal.

20. The method of claim 19, further comprising:
instructing the crystal turner to turning the crystal to a position corresponding to a value of maximum energy in the plurality of values.

* * * * *